United States Patent
Brandt et al.

[19]

[11] Patent Number: 6,068,782
[45] Date of Patent: May 30, 2000

[54] INDIVIDUAL EMBEDDED CAPACITORS FOR LAMINATED PRINTED CIRCUIT BOARDS

[75] Inventors: Lutz W. Brandt, Carlsbad; Goran Matijasevic, San Clemente; Pradeep R. Gandhi, Del Mar, all of Calif.

[73] Assignee: Ormet Corporation, Carlsbad, Calif.

[21] Appl. No.: 09/021,967

[22] Filed: Feb. 11, 1998

[51] Int. Cl.[7] .................................................. H01B 13/00
[52] U.S. Cl. ............................................... 216/17; 216/13
[58] Field of Search ........................ 216/13, 17; 438/794

[56] References Cited

U.S. PATENT DOCUMENTS

| | | | |
|---|---|---|---|
| 4,065,742 | 12/1977 | Kendell et al. | 338/9 |
| 4,409,608 | 10/1983 | Yoder | 357/51 |
| 4,437,140 | 3/1984 | Ohyama et al. | 361/402 |
| 4,460,938 | 7/1984 | Clei | 361/411 |
| 4,490,429 | 12/1984 | Tosaki et al. | 428/195 |
| 4,650,544 | 3/1987 | Erb et al. | 156/653 |
| 4,878,155 | 10/1989 | Conley | 361/401 |
| 4,908,258 | 3/1990 | Hernandez | 428/198 |
| 5,010,641 | 4/1991 | Sisler | 29/830 |
| 5,027,253 | 6/1991 | Lauffer et al. | 361/321 |
| 5,065,284 | 11/1991 | Hernandez | 361/414 |
| 5,079,069 | 1/1992 | Howard et al. | 428/209 |
| 5,155,655 | 10/1992 | Howard et al. | 361/303 |
| 5,161,086 | 11/1992 | Howard et al. | 361/321 |
| 5,162,977 | 11/1992 | Paurus et al. | 361/401 |
| 5,261,153 | 11/1993 | Lucas | 29/830 |
| 5,347,258 | 9/1994 | Howard et al. | 338/333 |
| 5,656,834 | 8/1997 | Grzyb et al. | 257/207 |

*Primary Examiner*—Jeffrie R Lund
*Attorney, Agent, or Firm*—Gray Cary Ware & Freidenrich LLP; Stephen E. Reiter; Ramsey R. Stewart

[57] ABSTRACT

A method of fabricating individual, embedded capacitors in multilayer printed circuit boards is disclosed. The method is compatible with standard printed circuit board fabrication. The capacitor fabrication is based on a sequential build-up technology employing a first patternable insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation or by depositing conductive ink.

19 Claims, 2 Drawing Sheets

INDIVIDUAL EMBEDDED CAPACITORS FOR LAMINATED PRINTED CIRCUIT BOARDS

FIELD OF THE INVENTION

The present invention relates to the manufacture of laminated printed circuit board (PCB) and multichip module (MCM) substrates having individual, embedded capacitors as components integral to the substrate.

BACKGROUND OF THE INVENTION

A laminated printed circuit board or multichip module serves as a support substrate for electronic components, such as ICs, resistors, capacitors, inductors, and other components. The laminated printed circuit board (PCB) or multichip module also provides conductive traces for conveying electric current to the terminals of the electronic components. In multilayer constructs each layer may contain circuitry. The layers are electrically connected by means of conductive vertical interconnects (or vias) within the multilayer structure or by electrically conductive vias (through holes) which pass through the entire substrate.

Discrete passive electronic components such as capacitors and resistors which are attached to the printed circuit board generally take up to 60% of the printed circuit board real estate, limiting the space available for active components (e.g. ICs). Therefore, removal of passive components from the PCB surface and their integration into a multilayer board could provide for further miniaturization and increased computing power of the electronic devices. Other benefits are improved environmental stability and reduced system noise and noise sensitivity due to shortened leads. Prime candidates for embedded passive components are decoupling or bypass capacitors as well as termination resistors. Particularly at high frequencies, these functions are often difficult or impossible to perform by passive through-hole or surface-mount components located on the board surface.

In contrast to ceramic thick film and Si-wafer based thin film multichip modules, an efficient embedded passives technology for laminated multilayer boards does not presently exist. This is due to incompatibility of the current materials and processes with printed circuit board fabrication. However, since fabrication of laminated, multilayer PCBs is comparatively inexpensive, the availability of such a technology for PCBs would be very desirable. The invention addresses this need and describes a method of fabricating individual, embedded capacitors for multilayer printed circuit boards.

The concept of embedded capacitance has been to some limited extent addressed earlier in the example of "capacitive planes" (U.S. Pat. Nos. 4,908,258, 5,010,641, 5,261,153) providing a non-individual or "shared" capacitance. Capacitive planes consist of two laminated metal sheets insulated by a polymer based dielectric layer. Shared capacitance, as the name implies, requires the timed use of the capacitance by other components. In contrast, the invention detailed here permits the construction of individual, embedded capacitors anywhere inside or on the top surface of a laminated multilayer board and therefore offers high design flexibility. The critical element of the invention is the use of a patternable insulator which is patterned to define thickness and area of a capacitor dielectric.

BRIEF DESCRIPTION OF THE INVENTION

There exists a need for an efficient embedded passives technology such that individual capacitors can be incorporated into layers of a PCB in order to more effectively and efficiently utilize the available space. In accordance with the present invention, it is demonstrated that individual capacitors can be embedded into a laminated multilayer printed circuit board. Freeing the board surface from discrete, passive components allows an increased "silicon chip" ratio as well as improved noise characteristics compared to a board with capacitors mounted on top of the board. The latter is of particular importance for high frequency applications where embedded passive components provide for very short lead connections which in turn reduce the problematic lead inductance.

By way of a generalized summary, the invention involves a first patternable insulator for the fabrication of individual, embedded capacitors. In this invention, capacitor bottom electrodes and other circuitry are formed on a suitable substrate by etching copper laminate, by depositing a conductive ink in the desired pattern, or by other techniques known in the art. In a second step, a first patternable insulator is applied to the substrate either in liquid or dry form. The purpose of this low dielectric constant insulator is to define the location, area and height of the capacitor dielectric as well as to insulate the bottom circuitry from the top layers. A pattern is formed on the insulator (e.g. by photopatterning). Into this pattern the capacitive dielectric material is then deposited by either fully or partially filling the pattern groove. Capacitor top electrodes may be fabricated in a similar manner as the bottom electrodes or use is made of the partially filled pattern groove to fill the remainder of it with an appropriate conductor material. By repeating the process with additional layers containing capacitive dielectric and by alternating power and ground connections to the electrodes, multilayer capacitors can also be built.

BRIEF DESCRIPTION OF THE FIGURES

The sequential build up of an individual, embedded capacitor is described in FIGS. 1–6.

DETAILED DESCRIPTION OF THE INVENTION

In accordance with the present invention, there are provided methods to fabricate individual, embedded capacitors. Invention methods comprise: forming capacitor bottom electrodes and other circuitry onto a suitable substrate, applying a first patternable insulator, patterning of the insulator to define location, area and height of a capacitive dielectric, and development of the pattern, depositing a capacitive dielectric into the pattern, and creating capacitor top electrodes and other circuitry on top of or in the patterned layer. The individual capacitors are electrically connected to the same and/or other PCB layers.

Figure 1:
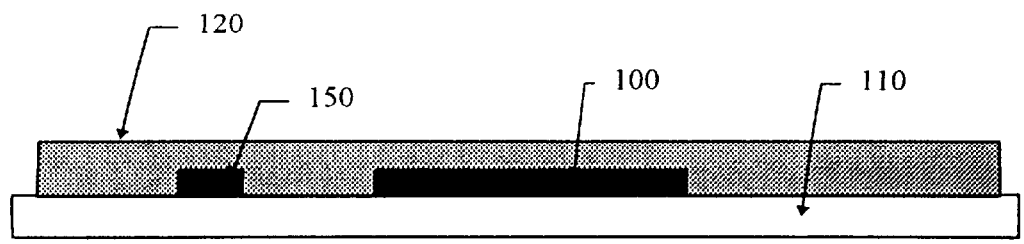
FIG. 1 depicts a (photo)patternable insulator 120 which has been applied to a substrate 110 containing the bottom electrode 100 and other circuitry 150.

In one embodiment, as shown in FIG. 1, the process of the present invention begins with the fabrication of bottom electrodes 100 and other circuitry 150 on a substrate 110 by standard PCB processes such as by etching copper laminate, metal evaporation or depositing other electrically conductive materials such as PTF inks or TLPS pastes in a desired pattern. As further shown in FIG. 1, a patternable insulator 120 is then laminated or affixed by other suitable means onto the PCB substrate. The insulator is then prepared to receive the capacitive dielectric in order to form individual, embedded capacitor(s). The method of preparation comprises forming a desired pattern on the patternable insulator. The pattern will define one or more regions to be filled with a capacitive dielectric.

Figure 2:
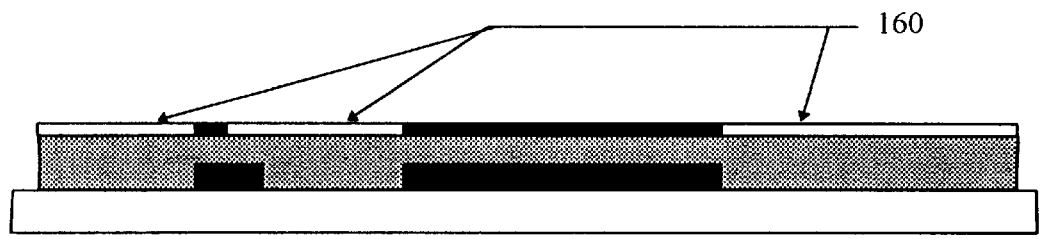
FIG. 2 depicts a photomask 160 defining a desired pattern on the insulator upon, for example, exposure to UV light.
Figure 3:
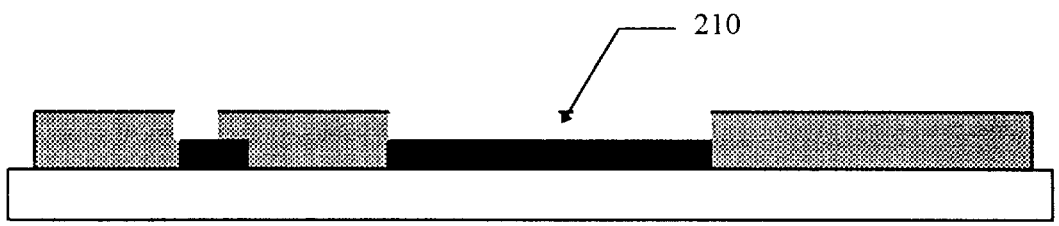
FIG. 3 depicts the pattern grooves 210 formed in the insulator after development.

In one embodiment of the invention, the insulator is photopatternable. In this embodiment, as shown in FIG. 2, a photomask 160 is applied to the insulator, followed by exposure to, for example, UV radiation. Subsequent development of the exposed areas results in the desired pattern 210 as shown in FIG. 3.

Figure 4:
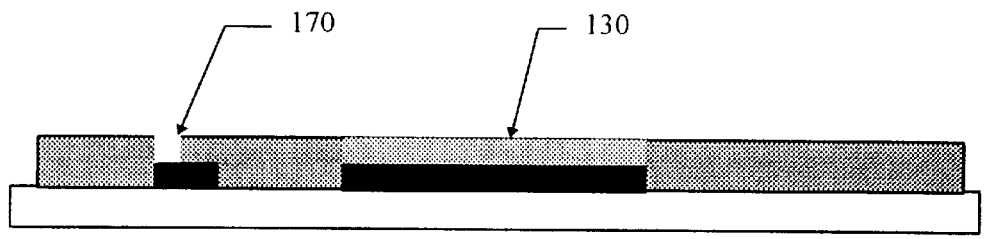
FIG. 4 depicts the pattern groove filled with a capacitive dielectric 130. A via groove 170 provides an electrical connection to the bottom layer.

The creation of one or more individual, embedded capacitors next involves, as shown in FIG. 4, depositing at least one capacitive dielectric material 130 into the selectively formed pattern. The capacitance of the capacitor can be defined by adjusting the thickness of the second patternable insulator, or adjusting the fill depth of the capacitive dielectric, or a combination of both. In one embodiment the capacitive dielectric can be also deposited through a mask residing on top of the patterned insulator either by physical or chemical vapor deposition or flamespray techniques. This technique may lead to thinner films and higher dielectric constants of the material.

In multilayer boards vertical electrical interconnects between the individual layers have to be provided. Apart from the capacitive dielectric pattern, FIG. 4 also shows a via pattern 170 in the insulator to be later filled with conductive material 190 (FIG. 6) electrically connecting the multiple layers of the PCB.

Following the deposition of the capacitive dielectric one or more additional capacitor electrodes and other circuitry-containing layers may be formed on top. As described for the capacitor bottom electrodes, capacitor top electrodes and other circuitry are fabricated by the standard process of etching copper, or alternatively, by one or more of the techniques of physical vapor deposition, chemical vapor deposition, flame spray, thermal decomposition of suitable metal-organic compounds into metallic films or by deposition of conductive PTF inks or TLPS pastes. "Suitable metal-organic or organo-metallic compounds" are chemical compounds which either decompose thermally (ideally far below 300° C.) or by high energy light irradiation into a pure metal film while shedding their organic fragments into the gas phase. The compounds are typically based on precious metals such as Ag, Au, Pd, and Pt, which do not oxidize under the decomposition conditions. The type of compounds and their structure are well-known in the field of metal-organic chemical vapor deposition (MOCVD).

Figure 5:
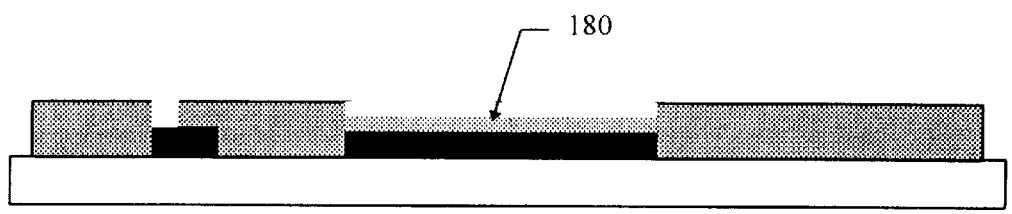
FIG. 5 depicts a capacitive dielectric 180 only partially filling the patterned insulator.
Figure 6:
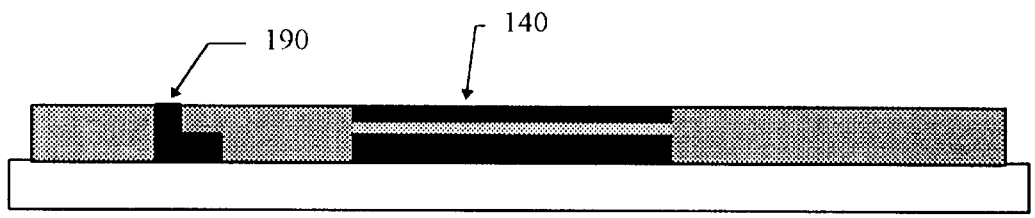
FIG. 6 depicts the fabrication of the capacitor top electrode 140 and electrical via 190 by depositing a conductive material such as a polymer thick film (PTF) ink or a transient liquid phase sintering (TLPS) paste into the pattern of the same patterned insulator that was partially filled with the capacitive dielectric material.

In another embodiment, as shown in FIG. 5, the patternable insulator is only partially filled with capacitive dielectric 180. In that case, as shown in FIG. 6, capacitor top electrodes 140 may be formed by depositing a conductive material into the same pattern. Deposition of conductive materials such as conductive PTF inks, TLPS pastes or metal-organic compounds are especially suitable electrode materials for this embodiment.

Substrates contemplated for use are materials typically employed in the printed circuit board industry such as glass filled epoxies, polyesters, phenolics, polystyrenes, polyimides, and the like. The use of ceramic and insulated metallic substrates is also contemplated for the present invention.

The materials contemplated for the patternable insulator include photopatternable epoxy, epoxy-acrylate or polyimide based resins which can be commercially obtained in liquid or dry form. In the dry sheet form, the insulator can be laminated, while in the liquid form it can be spin-coated, curtain-coated, screen-printed, etc., to a desired thickness. The useful thickness of the patternable insulator ranges from 5 $\mu$m to 100 $\mu$m.

The capacitor dielectric can be a polymer, a polymer/ceramic (metal oxide) composite or a ceramic (metal oxide) material. Examples for polymers are epoxies, polyimides, polyurethanes, parylene, polysulfones, polysulfides, benzylcyclobutenes (BCBs), certain nylons, polyvinylidene fluoride (PVDF), etc. Examples for ceramics and metal oxides are $TiO_2$, $Ta_2O_5$, $BaTiO_3$ (BT), $SrTiO_3$, $PbZrTiO_3$ (PZT), $LiNbO_3$, $PbMgTiO_3$ (LMT), $PbMgNbO_3$ (LMN), etc. If used in a polymer/ceramic composite the ceramic powder typically has a useful particle size between 20 nm and 20 $\mu$m. Thickness of the capacitor dielectric layer is determined by both the thickness of the first patternable insulator as well as the solvent content of the capacitor dielectric. The solvent is evaporated during the thermal processing resulting in a shrinkage to the desired thickness of the capacitor dielectric. The polymer or polymer/ceramic composite can be deposited by standard techniques such as screen-printing, stenciling, spray-coating and doctor-blading. Useful thickness of the processed polymer or polymer/ceramic composite dielectric ranges from 0.1 $\mu$m to 100 $\mu$m. The capacitive dielectric may also be formed from more than one layer of different capacitive dielectric materials in order to tune the electronic properties of the capacitor component or for insulation purposes (i.e., elimination of pin holes).

In one embodiment a capacitor top electrode and other circuitry can be created in a similar fashion as the bottom electrode. This is preferably from etched copper, conductive inks or other suitable methods. If the top electrodes are to be made from conductive ink, one may, in another embodiment, precede ink deposition by first depositing a thin metal film on top of the capacitor dielectric. This can be achieved, for example, by chemical vapor deposition, physical vapor deposition, flamespray techniques, thermal decomposition of a suitable metal-organic compound, or electroless or electrolytic plating with the metals such as Ni, Pd, Sn, Ag, Cu or SnPb. A mask may be employed in this process. Since thus formed metal films are very thin and fragile they can be overlaid with a protective layer of conductive ink or TLPS paste. The thin metal interlayers improve the contact between the electrode material and the capacitor dielectric and therefore increase the capacitance and the Quality-factor (Q-factor) of the capacitor.

In another embodiment, a multilayer capacitor can be formed by repeating the capacitor dielectric layer and by connecting the alternating capacitor electrodes to power and ground. In order to maintain coplanarity, it is a preferred embodiment of the present invention that each electrode/circuitry and capacitor dielectric layer is fabricated with a patternable insulator such as a photoimageable polymeric film.

In another variation of the invention, a suitable metal board such as polished aluminum, steel or copper can be used to function as a common electrode, typically the bottom electrode, for more than one capacitor. In this approach, the first patternable insulator is applied directly to the metal board followed by patterning, filling with capacitive dielectric and deposition of the top electrodes.

By employing a gridded plane concept, the invention can be also used to create large area capacitors or capacitive planes of uniform thickness. It is very difficult, if not impossible, to deposit from a liquid a thin capacitive dielectric film of controlled thickness onto a large printed circuit board due to the inherent warpage and thickness variation of the substrate material. Additionally, doctor-blades tend to bend and scoop more material in the middle than at the edges of a patterned insulator. This can be overcome either by keeping the area small or by the breaking up of a large area by a grid of lines, circles or other geometric patterns, which keeps the blade at a defined distance from the board. A gridded plane brakes up the solid plane with geometric features and allows uniform material deposition into a pattern which covers a comparatively large area (e.g., >0.25 $cm^2$) on a laminated printed circuit board.

It is a preferred embodiment of the invention to apply a polymeric insulator on top of capacitor electrodes and other circuitry, to pattern it by means of photoimaging and then to fill the grooves of the patterned polymeric insulator with conductive ink such as by screen-printing, stenciling, doctor-blading, spray-coating or jetting. The conductive inks contemplated for use are metal loaded (e.g., Cu, Ag) polymer thick film (PTF) inks as well as transient liquid phase sintering (TLPS) pastes. TLPS pastes differ from PTF inks in that they contain an additional solder alloy component allowing for the formation of a highly conductive, metallurgical network during thermal processing. As the electrode material greatly influences both capacitance and Quality-factor of the capacitor, electroless or electrolytic copper plating of the capacitor electrodes and other circuitry may be performed in order to improve the capacitor properties.

The product of this invention is a multilayer printed circuit board with one or more individual embedded capacitors, which is shown in FIG. 6, wherein the multilayer printed circuit board comprises one or more internal layers of a patternable insulating material which has been selectively patterned to define one or more capacitors. The selected form is filled with one or more capacitive dielectric materials such that one or more capacitors are formed therein.

The invention will now be described in greater detail by reference to the following, non-limiting examples.

EXAMPLE 1

A polished aluminum board is laminated with a commercial, patternable insulator in form of a 1 mil thick dry polymeric film. The aluminum board forms the bottom electrode. The film is patterned photolithographically with a 6×6 array of squares and circles, each of 0.25 $cm^2$ area. After development of the film, the pattern is filled by means of doctor-blading with a barium titanate/epoxy composite of high solvent content. The solvent is evaporated and the epoxy composite cured for 10 min. at 220° C. Subsequently, a second insulator film is laminated, or applied over the first, photoimaged and developed producing the same pattern. The pattern is filled with a conductive TLPS paste by means of doctor-blading. Curing of the paste is achieved at 220° C./5 min. Excess ink is removed from the test coupon surface by sanding. The ink is then plated for 20 min. in an electroless copper bath (CUPOSIT/Shipley) and soldered in a regular tin lead soldering bath. Capacitance values in the particular example were typically 800 pF with a Quality-factor of about 40 at 1 MHz. Cross sections of the capacitors showed the thickness of the capacitor dielectric to be 6 µm. The common bottom electrode also permits testing of a so-called 'floating capacitor' arrangement by attaching the probe to two top electrodes (instead of to top and bottom electrode). In this case a capacitance of typically 400 pF was measured. This is in agreement with the theoretical reduction of area capacitance by a factor of ¼.

EXAMPLE 2

A polished copper-clad FR4 board is laminated with a commercial, patternable insulator in form of a 2 mil thick dry polymeric film. The copper serves as the bottom electrode. The film is patterned photolithographically with a 6×6 array of squares and circles, each of 0.25 $cm^2$ area. To increase the breakdown strength of the capacitor dielectric, a thin parylene coating of about 100 nm thickness is deposited first into the pattern, followed by doctor-blading of a solvent rich barium titanate/epoxy composite as the capacitor dielectric material. The solvent is evaporated and the epoxy composite cured for 10 min. at 220° C. Due to large shrinkage of the epoxy composite, conductive TLPS paste can be doctor-bladed directly into the grooves without requiring another dry film layer. Curing of the paste is achieved at 220° C./5 min. Excess ink is removed from the test coupon surface by sanding. In the particular example, capacitance values were 500 pF for an 8 µm thick capacitive dielectric with a Quality-factor of about 40 at 1 MHz. Breakdown voltage is about 200–300 V.

EXAMPLE 3

The uniformity of the dielectric thickness is examined by dividing a large plane into smaller, separate squares. A polished steel board is laminated with a commercial, patternable insulator in form of a 1.5 mil thick dry polymeric film. The steel board forms the bottom electrode. The film is patterned photolithographically with a 20×20 grid of squares, each of 0.25 $cm^2$ area and separated by 0.25 mm thick grid lines. After development of the film, the pattern is filled by means of doctor-blading with a barium titanate/epoxy composite of high solvent content as the capacitor dielectric material. The solvent is evaporated in a drying step at 95° C. and the epoxy composite cured for 10 min. at 220° C. Subsequently a second patternable insulator film is laminated, or applied over the first, photoimaged in the same pattern and developed (electrodes are not connected to one another in order to test the capacitors individually). The pattern is filled with a conductive TLPS paste by means of doctor-blading. Curing and sintering of the paste is achieved at 220° C./5 min. Excess ink is removed from the test coupon surface by sanding. Capacitor values of each 0.25 $cm^2$ segment were typically 500 pF for a 10 µm thick capacitive dielectric. Standard deviation of capacitance was less than 5% proving the uniformity of the thickness of the capacitive material.

EXAMPLE 4—Multilayer Capacitor

The principle of fabricating a multilayer capacitor is described on the example of a two-layer capacitor. A copper-clad FR4 board is laminated with a 1 mil thick, commercial dry film for insulation. A second dry film is laminated and photopatterned with 6 sets of 4 'ground' electrodes (0.5 cm×0.5 cm) as well as interconnect circuitry. Conductive ink is doctor-bladed into the grooves, cured at 220° C./5 min. and plated electroless with copper (CUPOSIT/Shipley). A third dry film layer is laminated and photopatterned with the capacitive dielectric pattern of 0.55 cm×0.55 cm as well as vias for vertical electrical interconnects. The vias are masked off and a solvent rich barium titanate/epoxy composite is doctor-bladed into the capacitor dielectric pattern. The via mask is removed, the solvent evaporated in a drying step at 95° C./30 min. and the epoxy composite cured for 10 min. at 220° C. Subsequently, a fourth photopatternable dry film is laminated, and photoimaged with a pattern for the 'power' electrodes (0.5 cm×0.5 cm), interconnect circuitry and vias. The pattern is filled with conductive TLPS paste, which is processed and plated as before. In the same step the vertical interconnect vias of the previous layer are also filled. A fifth dry film layer, patterned for a second capacitive dielectric (0.55 cm×0.55 cm), as well as vias, is processed in the same manner outlined before. The sixth and final dry film layer with the patterned 'ground' electrodes (0.5 cm×0.5 cm), interconnect circuitry and vias is fabricated as before, filled with TLPS paste and plated. Capacitance values in the particular example were typically 1000 pF at 1 MHz with a Quality-factor of about 35.

EXAMPLE 5

A large area capacitor or capacitive plane of thin, uniform dielectric thickness is created by employing a gridded plane. In contrast to example 3 the plane does not consist of individual squares; rather a grid of little insulator circles ensures uniform thickness of the deposited material. A polished aluminum board is laminated with a commercial, patternable insulator in form of a 2.0 mil thick, dry polymeric film. The aluminum board functions as the bottom electrode. The film is patterned photolithographically with a 3.8 cm×12.2 cm rectangular pattern containing a grid of 10 mil radius circles at 50 mil centers. After development of the film, the pattern is filled by means of doctor-blading with a barium titanate/epoxy composite of high solvent content as the capacitor dielectric material. The solvent is evaporated in a drying step at 95° C. and the epoxy composite cured for 10 min. at 220° C. Due to the high shrinkage of the capacitor dielectric, sufficient space remains to fill the same pattern with a conductive TLPS paste by means of doctor-blading. Curing and sintering of the paste is achieved at 220° C./5 min. Excess ink is removed from the test coupon surface by sanding. Capacitance for a 15 µm thick capacitive dielectric layer was measured to be 96 nF.

While the invention has been described in detail with reference to certain preferred embodiments thereof, it will be understood that modifications and variations are within the spirit and scope of that which is described and claimed.

That which is claimed is:

1. A method for preparing an insulator having individual, embedded capacitor(s) within or on top of a laminated printed circuit board (PCB), said method comprising forming a desired pattern of through-holes in a patternable insulator, and filling said through-holes with a capacitive dielectric, followed by depositing thereon capacitor electrode(s), thereby resulting in individual embedded capacitors.

2. A method for creating individual, embedded capacitors within or on top of a laminated printed circuit board (PCB), said method comprising depositing at least one capacitive dielectric into a selectively formed pattern on a patternable insulator, wherein said insulator is located on capacitor electrode and other circuitry containing layer of a PCB, followed by depositing thereon capacitor top electrode(s) to form at least one individual capacitor.

3. A method for creating individual, embedded capacitors within or on top of a laminated printed circuit board (PCB), said method comprising selectively forming a desired pattern on a patternable insulator, wherein said insulator is to be located on or between one or more capacitor electrode and other circuitry containing layers of the PCB, and depositing at least one capacitive dielectric into said pattern, followed by depositing thereon a capacitor electrode to form at least one individual capacitor which is electrically connected with one or more circuitry-containing layers.

4. The method according to claim 3, wherein said formed pattern comprises a gridded plane, said gridded plane further comprising geometric features such as lines and/or circles.

5. The method according to claim 3, wherein said formed pattern is only partially filled with capacitive dielectric.

6. The method according to claim 5, wherein capacitor top electrodes are formed by depositing a conductive material into the pattern of the same patterned insulator that was partially filled with the capacitive dielectric material.

7. The method according to claim 5, wherein capacitor top electrodes are formed by depositing conductive PTF inks and TLPS pastes into the pattern of the same patterned insulator that was partially filled with the capacitive dielectric material.

8. The method according to claim 3, wherein the capacitance of said capacitor is defined by adjusting the thickness of the patternable insulator, or adjusting the fill depth of the capacitive dielectric, or a combination of both.

9. The method according to claim 3, wherein the capacitive dielectric is formed from more than one layer of different capacitive dielectric materials.

10. The method according to claim 3, wherein the capacitive dielectric is a polymer, a polymer/ceramic composite, or a ceramic material.

11. The method according to claim 3, wherein said capacitor electrodes are fabricated by etching copper.

12. The method according to claim 3, wherein said capacitor electrodes are fabricated by one or more of the techniques of physical vapor deposition, chemical vapor deposition, flame spray, or thermal decomposition of suitable metal-organic compounds.

13. The method according to claim 3, wherein said capacitor electrodes are fabricated from conductive polymer thick film (PTF) inks or conductive transient liquid phase sintering (TLPS) pastes.

14. The method according to claim 13, wherein said conductive inks and TLPS pastes are subject to electroless plating or are plated electrolytically with the metals such as Ni, Pd, Sn, Ag, Cu or SnPb.

15. The method according to claim 13, wherein said fabrication of capacitor electrodes with conductive ink or TLPS paste is preceded by deposition of a thin metallic layer formed by physical vapor deposition, chemical vapor deposition, flame spray, or thermal decomposition of metal-organic compounds.

16. The methods of claim 3, wherein said patternable insulator is between about 5 μm and 100 μm thick.

17. The method of claim 3, wherein said capacitive dielectric is between about 0.1 μm and 100 μm thick.

18. The method according to claim 3, wherein more than one capacitor uses the same capacitor electrode, said electrode comprising a plane of suitable electrode metal.

19. The method according to claim 3, wherein one or more iterations of the following steps is performed following deposition of the capacitive dielectric:

where N is greater than or equal to 2, an Nth patternable insulator is applied on top of the N−1 patternable insulator layer and a pattern is selectively formed thereon for capacitor electrodes, circuitry and/or vias, which are subsequently filled with an appropriate conductor material;

a N+1 patternable insulator is applied on top of the Nth patternable insulator, an additional pattern is selectively formed thereon for individual embedded capacitors, and said additional pattern is filled with a capacitive dielectric.

* * * * *